United States Patent [19]

Anderson

[11] Patent Number: 4,965,472
[45] Date of Patent: Oct. 23, 1990

[54] PROGRAMMABLE HIGH SPEED STATE MACHINE WITH SEQUENCING CAPABILITIES

[75] Inventor: Robert E. Anderson, Beaverton, Oreg.

[73] Assignee: Cypress Semiconductor Corp., San Jose, Calif.

[21] Appl. No.: 231,229

[22] Filed: Aug. 11, 1988

[51] Int. Cl.⁵ .......................................... H03K 19/177
[52] U.S. Cl. .................................... 307/465; 307/469; 364/716
[58] Field of Search ............................... 307/465–469; 364/716

[56] References Cited

U.S. PATENT DOCUMENTS

| | | | |
|---|---|---|---|
| 4,415,818 | 11/1983 | Ogawa et al. | 307/465 |
| 4,488,229 | 12/1984 | Harrison | 307/465 X |
| 4,663,545 | 5/1987 | Pumo et al. | 307/465 X |
| 4,675,556 | 6/1987 | Bazes | 307/465 |
| 4,758,746 | 7/1988 | Birkner et al. | 364/716 X |
| 4,786,829 | 11/1988 | Letcher | 307/465 |
| 4,831,573 | 5/1989 | Norman | 307/465 X |
| 4,855,954 | 8/1989 | Turner et al. | 364/716 X |

OTHER PUBLICATIONS

Davis, "Enhanced State Sequencer for Sequential Logic Array", IBM T.D.B., vol. 26, No. 1, Jun. 1983, pp. 99–104.

Primary Examiner—David Hudspeth
Attorney, Agent, or Firm—Blakely, Sokoloff, Taylor & Zafman

[57] ABSTRACT

Programmable high speed state machines with sequencing capabilities based on a dual array structure with state information and fast sequencing logic placed between the two arrays are disclosed. The state section consists of multiple registered macrocells which are connected to function as program counters and decoders to the output array. The input array has feedback from the state registers and input from the dedicated inputs and input/output pins around the device. The inputs of the input array are all individually configurable as registered or nonregistered, with the inputs being divided into three groups, input/output, Mealy and simple inputs, with three enable product terms from the output array controlling the respective groups. Various additional characteristics, features and capabilities of the invention are disclosed.

8 Claims, 6 Drawing Sheets

FIG_1

FIG_2

FIG_3

REGISTER STAGE

FIG_4

OPCODE 1:
IF (CONDITION) START;

FIG _ 5

OPCODE 2:
IF (CONDITION) TERMINATE;

FIG _ 6

OPCODE 3:
IF (CONDITION) TOGGLE;

FIG_7

FIG_8

FIG_9

FIG_10

PROGRAMMABLE HIGH SPEED STATE MACHINE WITH SEQUENCING CAPABILITIES

BACKGROUND OF THE INVENTION

1. Field of the Invention.

The present invention relates to the field of programmable logic devices, and more particularly, logic devices programmable to operate as state machines.

2. Prior Art.

Programmable logic devices (PLDs) of various designs and functions are now well-known in the prior art. Originally appearing as gate arrays to reduce the chip count in random logic circuits, various more sophisticated configurations are available to provide sequencing capabilities, branching capabilities, and the like. These devices however, in general have various limitations which effect their speed, ease of programming, or versatility in a number of applications. With respect to speed, popular processor clock rates are currently as high as 24 megahertz, with clock rates of the next generation processors undoubtedly being substantially higher. With the advent of the microprocessor based work stations and professional personal computers, there is a substantial need for state sequencer functions with greater than a 50 megahertz clock rate to provide the sub-system control and synchronizing for these systems, including the initiation of events which occur in mid system clock cycles to satisfy signal setup and hold conditions, as well the initiation of those which are synchronized with the system clock. Accordingly, there is a need for programmable state machine operative at clock rates well above 50 megahertz, though preferably expanded in sequencing capabilities over existing devices and easily programmable for a wide variety of applications.

Currently there is only one integrated circuit chip which operates at the frequency range of interest. That chip is the AMD PEG 2971. This device however, is not a state machine but a sequence generator (PEG standing for programmable event generator) and accordingly is not useful in all applications in which a state machine may be used. The AMD 29PL141, on the other hand, is a combined sequencer and ROM in a single package. This part permits assembler syntax programming and computed branching but is currently limited in speed to approximately 20 megahertz, and perhaps 30 megahertz in the future. In addition, in the 29PL141 the branch designations are constrained to the ROM section boundaries, whereas in the present invention there is no such limitation. In addition, the condition calculation permitted by the present invention covers more of the machine context than the 29PL141 calculation, as the present invention considers the entire input and state context compared to the 29PL141 calculation over one input. The 29PL141 has a 35 nanosecond setup and a 15 nanosecond clock to output.

The Signetics PLS parts are also relevant as prior art because they represent a customer accepted state machine architecture. The '105 and '167 parts have 48 product terms (PTs) leading into an array of OR terms which drive R-S flip-flops. The setup time of the Signetics parts is about 35 nanoseconds. In that regard, Texas Instruments has advertised a 50 megahertz part, though the setup and hold times place this part in the 33 megahertz range for state machine designs. Also Signetics recently introduced a 405 part which has a 15 nanosecond setup and a 10 nanosecond clock to output: conditional timings which can allow for operation at up to 40 megahertz. However, the PLUS405A has no Mealy outputs (i.e. no combinational outputs), no skew control or minimum timing and no sequencing via macrocells. Other problems faced by the device in 40 megahertz operation include the necessity to control two inputs to each register (the part uses twice the number of product terms of the present invention), the loading of product terms when registers are used as T-types which slows the device down and the nonutility of the compliment path above 30 megahertz which makes coding more difficult.

The Prose chip from MMI is a 30 megahertz sequencer with one or three way conditional branching. Its principle limitations are the setup time and the limited condition calculation circuitry. The SAM from Altera is a large sequencer consisting of a 256 location ROM and condition calculation/branch control circuitry. Its main feature is its large ROM though it is expected to run at less than 30 megahertz. Finally, D speed PALs are available which can be used as small state machines to run at speeds up to about 50 megahertz. Available devices are bipolar 8 output devices with high power requirements. The information capacity of an 8 register device is small, so usually several such devices need to be combined for a circuit The purpose of the present invention is to provide an architecture which will result in a much faster programmable high speed state machine for a multitude of applications.

BRIEF SUMMARY OF THE INVENTION

Programmable high speed state machines with sequencing capabilities based on a dual array structure with state information and fast sequencing logic placed between the two arrays are disclosed. The state section consists of multiple registered macrocells which are connected to function as program counters and decoders to the output array. The input array has feedback from the state registers and input from the dedicated inputs and input/output pins around the device. The inputs of the input array are all individually configurable as registered or nonregistered, with the inputs being divided into three groups, input/output, Mealy and simple inputs, with three enable product terms from the output array controlling the respective groups. Various additional characteristics, features and capabilities of the invention are disclosed.

DETAILED DESCRIPTION OF THE INVENTION

Figure 1:
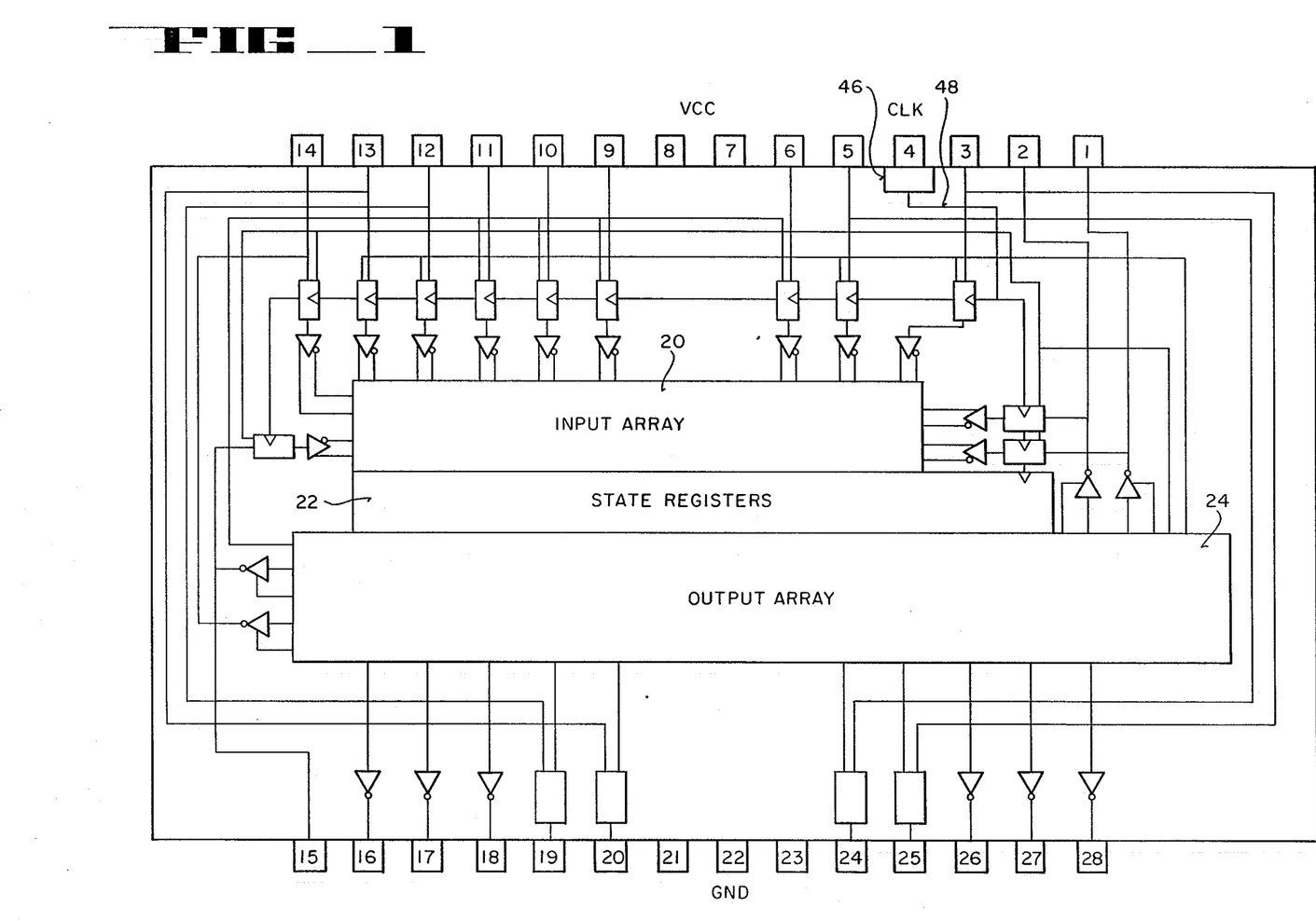
FIG. 1 is a block diagram of the preferred embodiment of the present invention.
Figure 2:
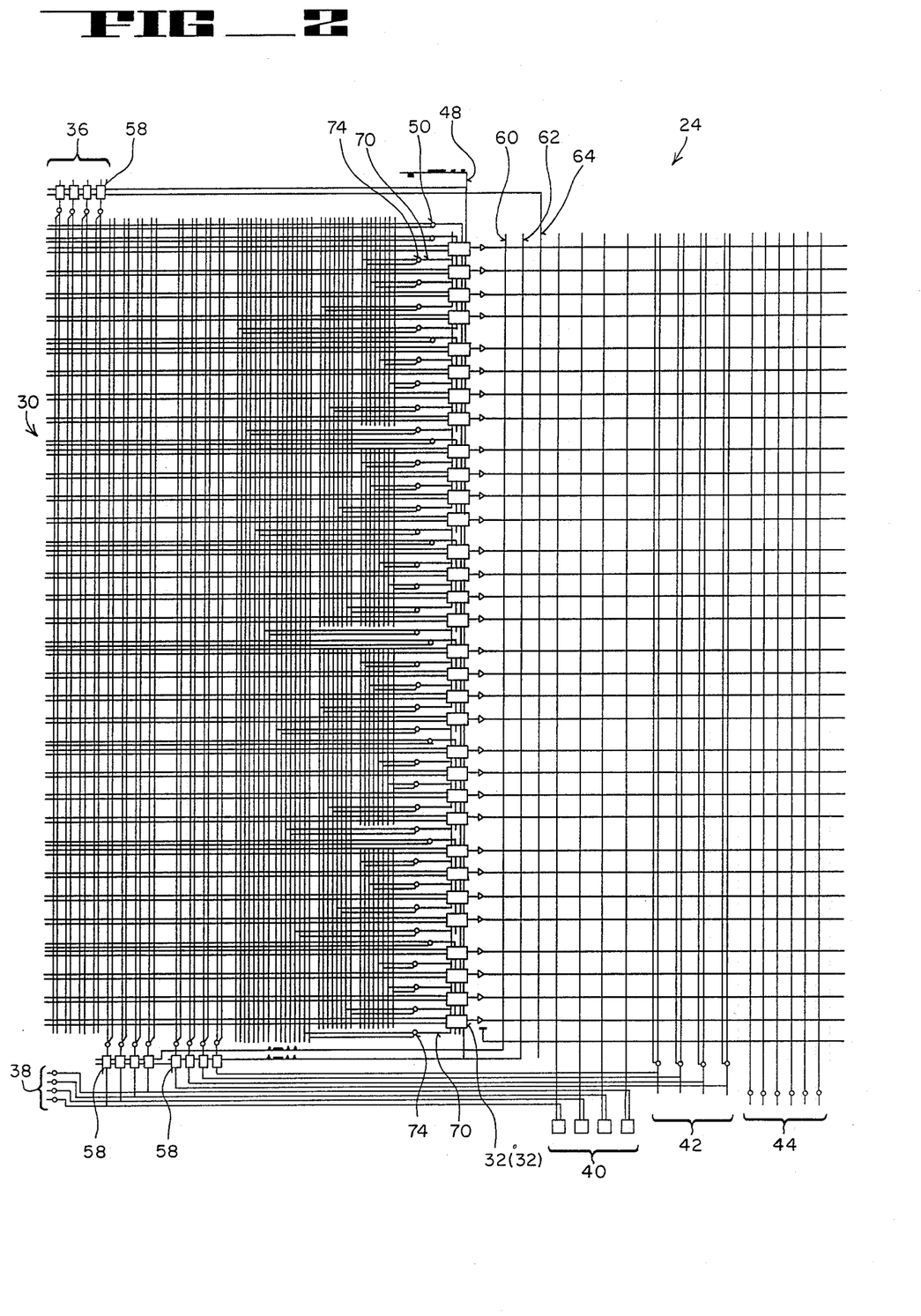
FIG. 2 is a schematic diagram of the state machine of FIG. 1.

First referring to FIGS. 1 and 2, a specific embodiment of the present invention may be seen. FIG. 1 is a block diagram of this embodiment, complete with exemplary pinouts as the device may be preferably realized in integrated circuit form and packaged in a conventional dual in line package. FIG. 2 on the other hand, is a schematic illustration of the entire device including the input array, state registers, output array, etc. The device of FIGS. 1 and 2 is comprised of an input AND array 30 which controls a state register section 32, in this embodiment 32 state registers 32(1) through 32(32). These state registers are connected to function as program counters and decoders to the output OR array 34.

The inputs to the input array comprise four registered inputs 36 (FIG. 2) comprising terminals 6, 9, 10 and 11 of FIG. 1. In addition, there are four inputs 38 (FIG. 2) comprising pins 3, 5, 12 and 13 of FIG. 1. These inputs are also registered inputs, though in addition, provide the input for the Mealy or combinational outputs 40 (FIG. 2) of output terminals 19, 20, 24 and 25 of FIG. 1. Still in addition, there are four terminals 42 (FIG. 2) comprising terminals 1, 2, 14 and 15 of FIG. 1 which are programmable to serve as registered inputs, or as outputs as desired. Finally, six outputs 44 (FIG. 2) of the output OR array are presented on terminals 16, 17, 18, 26, 27, and 28 of FIG. 1. Also, aside from power (VCC and ground), a clock input is provided on terminal 4 of FIG. 1, in the preferred integrated circuit form an on-chip frequency doubler circuit 46 being used to provide an on-chip clock signal on line 48 which is twice the system clock frequency to provide the desired mid system clock clocking of the device to provide state machine outputs at mid system clock cycles.

Figure 3:
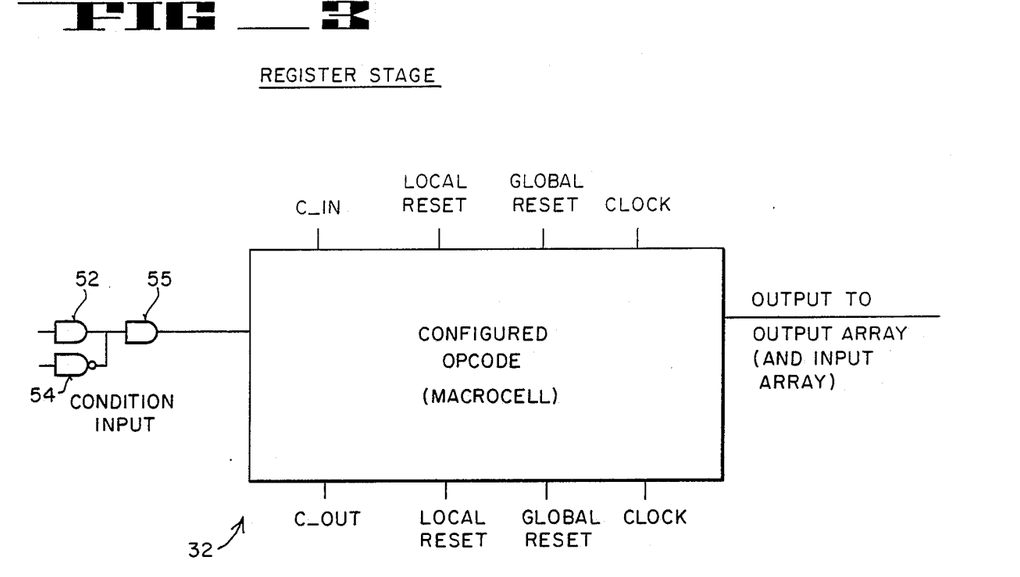
FIG. 3 is a block diagram of a generalized state register macrocell as used in the state machine of FIGS. 1 and 2.

A generalized state register macrocell 32 for the circuit of FIG. 2 may be seen in FIG. 3, thirty two such state registers being linked in the specific embodiment shown. Each state register has the (frequency doubled) clock signal coupled thereto, the same being coupled therefrom to the next state register in the chain. In addition, local reset and global reset lines are provided. As may be seen in FIG. 2, the global reset line is linked to all state registers and accordingly when active, is operative to reset all registers simultaneously. The global reset signal is derived from the upper two lines of the input array, the lower of these two lines being coupled through an inverter so that either a positive or a negative logic signal may be used to generate the global reset. For the local reset signal however, the state registers are grouped in groups of four so that a local reset signal similarly derived from either a positive or a negative logic signal from the input array will reset only the associated four state registers. This allows the resetting of any four state registers, or any multiple of four by simultaneously generating multiple local reset signals, up to a full global reset as desired. In addition, the state registers are cascaded in groups of four. Accordingly, each has a provision for an input signal from a prior macrocell and an output signal to the next macrocell, identified in FIG. 3 as $\overline{Cin}$ and $\overline{Cout}$ (negative logic signals). As may be seen in FIG. 2, the first $\overline{Cin}$ is clamped, thereby not coupling a signal thereto. The equivalent $\overline{Cin}$ signal for the first of each of the remaining state registers is coupled to the $\overline{Cout}$ of the immediately preceding state register in the chain, with the $\overline{Cout}$ of the last state register being coupled back to the input array. Finally, each state register has an input known as a condition input, and an output which is coupled to the output array of FIG. 2. The condition input can be coupled in through AND gates 52 and 55 as a positive logic signal, or through NAND gate 54 and AND gate 55 as a negative logic signal, the function of which shall be subsequently described.

Figure 4:
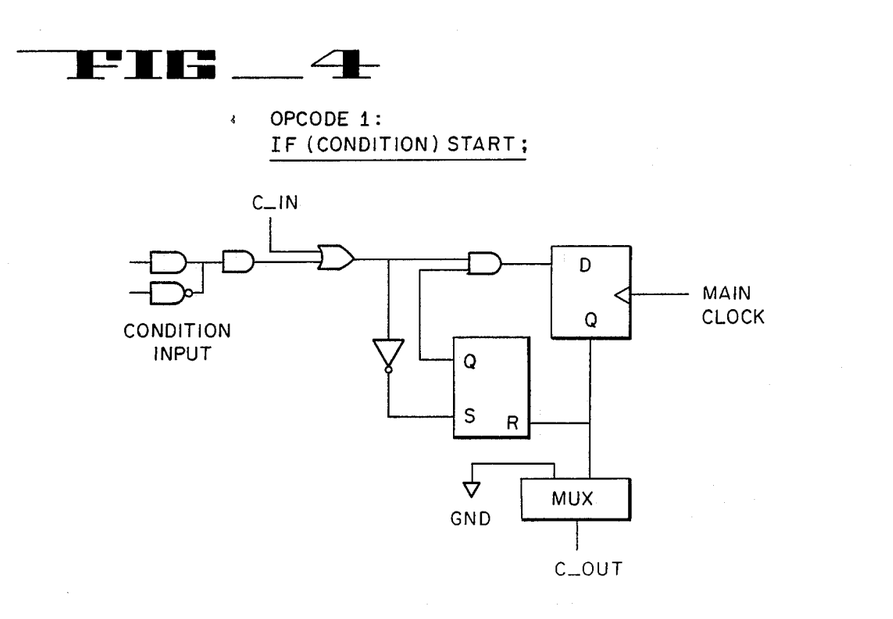
FIGS. 4, 5 and 6 are basic block diagrams for the programmed macrocells for the opcodes of START, TERMINATE and TOGGLE, respectively.
Figure 5:
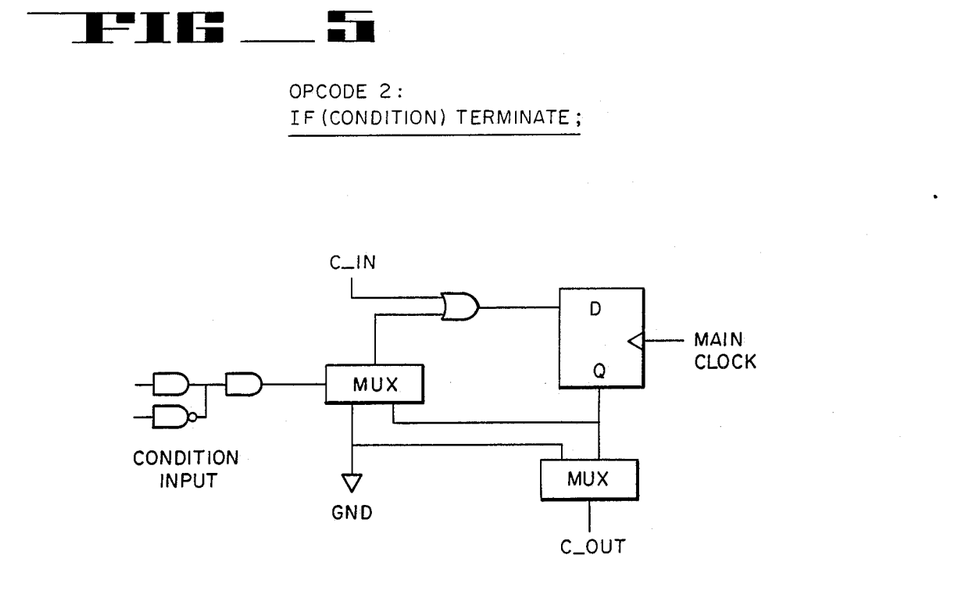
Figure 6:
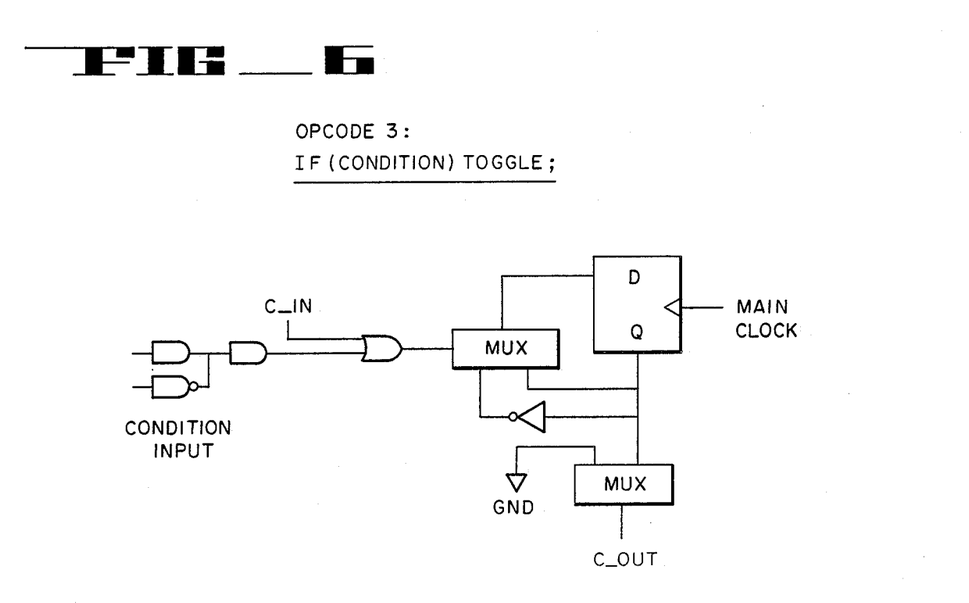

Each of the macrocells of FIG. 3 is programmable to operate in any one of three ways. These may be summarized as follows:

OPCODES:
1. IF (condition) START;
2. IF (condition) TERMINATE;
3. IF (condition) TOGGLE;

These opcodes dictate what happens if a condition is detected for any state register. The start operation causes the register to be set for exactly one cycle. The terminate operation causes a register to be reset, and the toggle operation causes a register to change state. The basic block diagrams for the programmed state registers for these three opcodes are illustrated in FIGS. 4, 5, and 6, respectively. Note that in addition to the condition input, there is a cascade bit $\overline{Cin}$ for each stage which specifies whether or not a set adjacent register is ORed with the condition input to the current stage (cascading of stages are the equivalent of in line continue clauses in a conventional sequencer). For the start and toggle operations, $\overline{Cout}$ follows the inverse of the register output to the output array, while a terminate operation ties $\overline{Cout}$ to ground.

The start configuration is normally a head node in the state transition graph. The asserting edge of the condition input decoder is used to set the corresponding register. The register is set only once for the condition assertion, and on the next clock cycle the register is cleared. Because of the O-ring of the cascade input $\overline{Cin}$ with the condition input, the cascade input has the same effect as the condition input, and of course the cascade input $\overline{Cin}$ signal for one stage comes from the $\overline{Cout}$ signal of the prior stage. In all configurations, the operation of the cascade output $\overline{Cout}$ is configured to either follow the state of the register or to perform no function in the next stage (ground).

The terminate output causes the state register to be reset. Normally, the terminate stage will follow other stages so that the $\overline{Cin}$ branch will cause the register to be set at a particular time, the register will then cycle and stay in a set state until the condition input is asserted at which time the state register will be reset. The toggle configuration turns the register stage into a toggle register that alternates states with each assertion edge of the associated condition input or $\overline{Cin}$ signal. There is in addition, a buried condition input for each four registers that causes synchronous resetting of the registers when the same are programmed to act as toggle stages. This is necessary for counting and demultiplexing.

Figure 7:
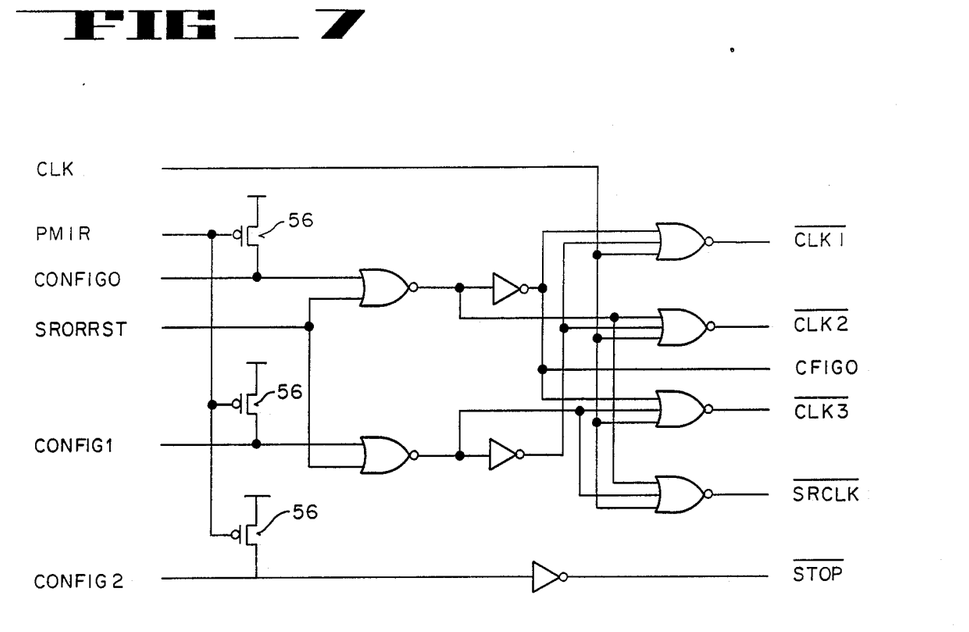
FIG. 7 is a detailed circuit diagram for the register configuration setting means of the state machine.
Figure 8:
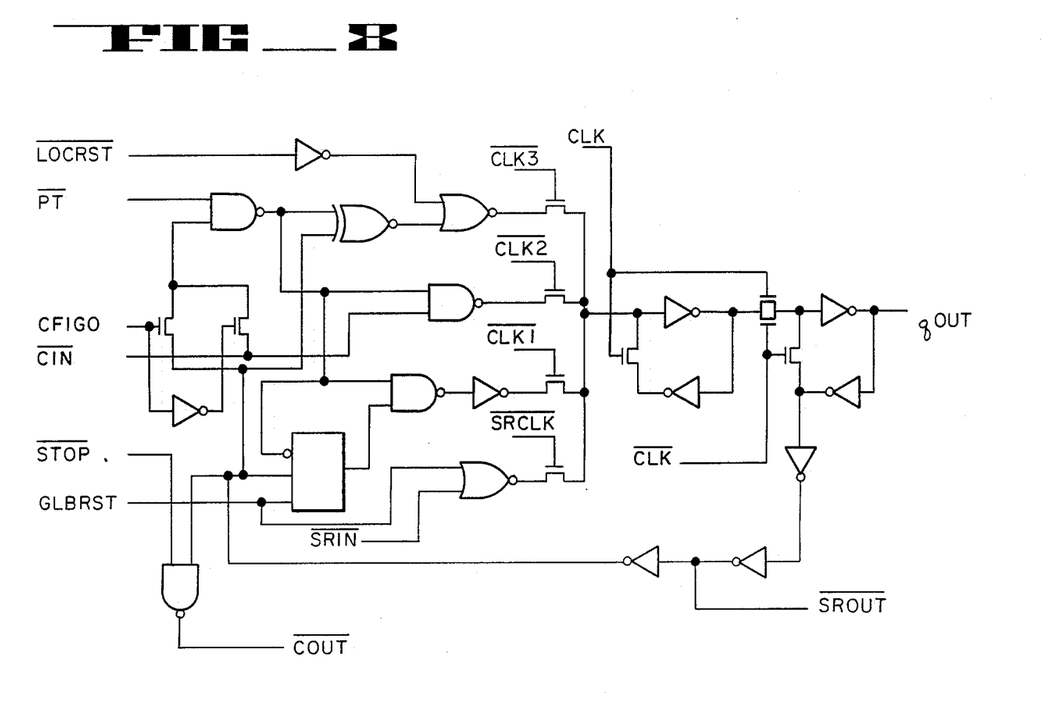
FIG. 8 is a detailed circuit diagram for a typical state register.

Now referring to FIGS. 7 and 8, detailed circuits for the macrocells and the registers therein may be seen. FIG. 7 is actually the register configuration setting associated circuitry. By coupling PMIR1 to ground, field effect devices 56 act as pull up resistors pulling CONFIG0, CONFIG1 and CONFIG2 high. For programming, two of these three signals are pulled low by programmed floating gate devices coupled between respective terminals (on chip) and ground. With CON- FIG0 being high, the CFIG0 signal is held high and the circuit is otherwise gated so that $\overline{CLK2}$ is the inverse of the clock signal CLK. At the same time, the other outputs of the circuit of FIG. 7 are all held low. By programming the register configuration setting means of FIG. 7 so that CONFIG1 is high, on the other hand, the gating provide $\overline{CLK3}$ as the inverse of the clock signal CLK, with the remaining output signals being held low. CONFIG2 high, with the other inputs low, provides a low state output for $\overline{STOP}$. At the same time the gating provides $\overline{CLK1}$ as the inverse of the clock signal CLK, with the remaining outputs being held low. Finally, a reset signal SRORRST to the register configuration setting means of FIG. 7 will result in an output clock signal $\overline{SRCLK}$ as the inverse of the clock signal CLK.

The various output signals of FIG. 7 are used to control the state register of FIG. 8. Additional inputs thereto include the condition input $\overline{PT}$ and the cascade input $\overline{Cin}$, as well as the local reset and global reset signals $\overline{LOCRST}$ and GLBRST. The output signals of course, include qout, the output of the state register to the output array, and $\overline{COUT}$, the cascade output to the next macrocell. The circuit is clocked by both the main clock signals CLK and the inverse thereof, $\overline{CLK}$, with $\overline{SRIN}$ and $\overline{SROUT}$ being register test points.

Figure 9:
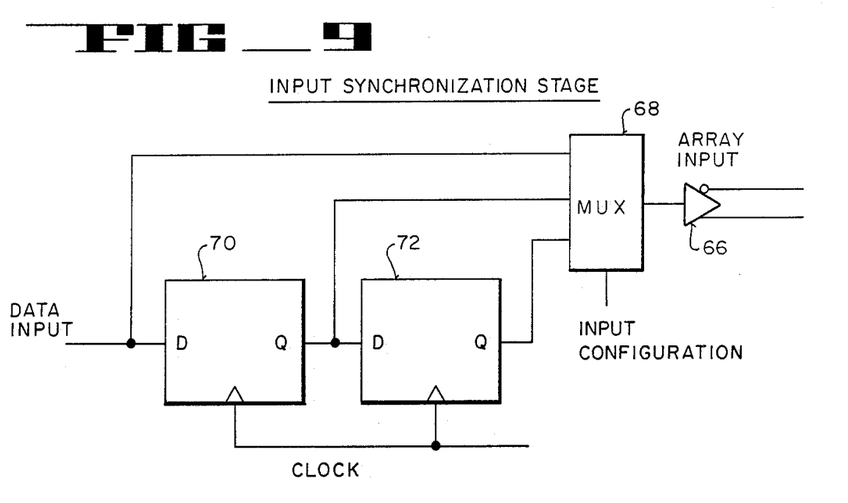
FIG. 9 is a block diagram of the circuit used to synchronize the state machine inputs with the system clock and mid system clock cycle.

Referring again to FIG. 2, it was previously noted that each of the inputs, whether the inputs 36, the inputs 38 which may also be used to provide the Mealy outputs, or the I/O terminals 42 when used as inputs, are registered by way of registers 58. These registers are clocked by the main clock signal on line 48 as enabled by a respective one of the three enable lines 60, 62 and 64 of the output array, a programmable OR array using as inputs the outputs of the state registers 32. The input registers themselves are programmable, as may be seen in FIG. 9. In particular, the external clock, typically the system clock, is doubled in frequency on chip so that mid system clock cycle states may be clocked thereby. For synchronization purposes and to avoid metastability problems, the programmable option of providing up to two registers on the input is provided. Thus, as may be seen in FIG. 9, the data input signal used to drive the input array through amplifier 66 which provides both the data signals and the inverse thereof to the input array, is coupled to the buffer 66 through a multiplexer 68 programmed in the preferred embodiment also by floating gate field effect devices. The multiplexer 68 is programmable to either directly pass the data input signal, to pass a signal delayed one clock cycle by D flip-flop 70, or to pass the signal delayed two clock cycles by D flip-flops 70 and 72. The clock cycle driving D flip-flops 72 and 74 of course, as with the other clock signals in the description herein, are the doubled system clock frequencies (or alternatively the direct system clock, dependent on the clock programming), so that the input data may be directly coupled, delayed one half a system clock cycle or synchronized (delayed a full system clock cycle) by the circuit of FIG. 9.

Figure 10:
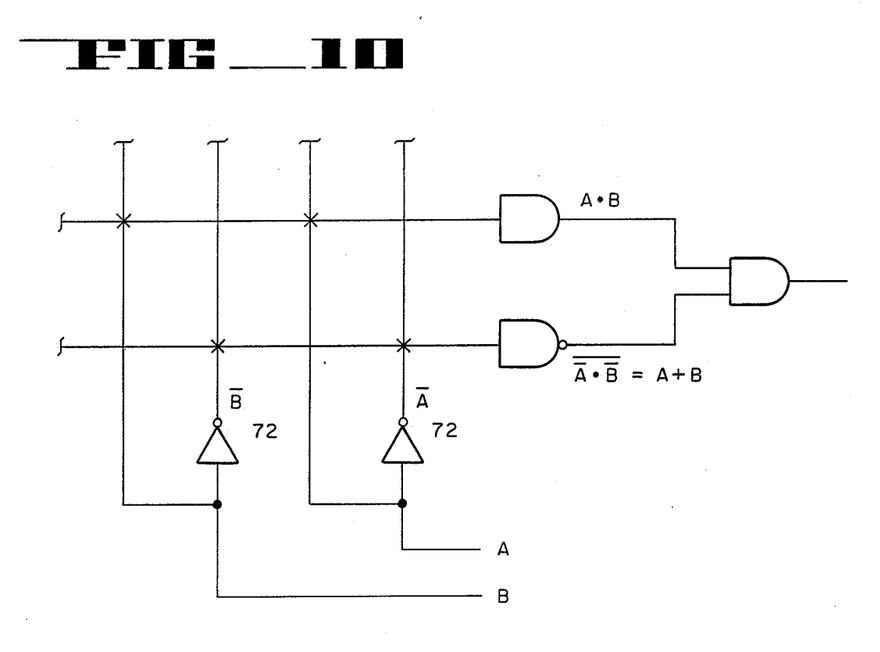
FIG. 10 is a circuit diagram illustrating the basic structure of the input AND gate array.

The basic input to the macrocells, whether responsive to inputs thereto from the input array or feedback from the state registers (not the cascaded signals) on lines 70, may be represented by the circuit of FIG. 10. Here, each of the inputs A and B are provided on a respective vertical line to the array, and provided in inverted form by inverters 72 to another respective vertical line of the array. With respect to the feedback from the state registers through line 70, these signals too are also provided both in direct form and inverted form by inverters 74 to corresponding vertical lines through the input array. At each crossing of the array line is a programmable floating gate device operative to provide no connection or an AND gate input thereto depending on the programming thereof. AND gates 52 and 55 as well as NAND gate 54 are schematically associated with the state register circuit of FIG. 3. The resulting gating provides as the condition input to each register the AND of an AND and an OR, or the product of a sum and a product.

The present invention has a number of features which alone or collectively provide a number of advantages over the prior art. One of these advantages is speed, in that the present invention is capable of very high speed operation in comparison to the prior art. In particular, in devices wherein the inputs are provided to a product array which drives an output array which in turn feeds a set of registers to provide both the outputs and the feedback to the product array, the cumulative delay of the device is the delay of the product array, plus the delay of the output array, plus the set up and the clocking times of the output registers. For CMOS devices the delay of the product array and the output array are each approximately 4 nanoseconds, with the register having approximately a 1 nanosecond setup and a 2 nanosecond clocking delay. Providing a margin for worst case conditions, such delays limit the operation of the device to something on the order of 70 to 75 megahertz. In the present invention however, the output array need not be within the feedback loop from the macrocell to the input array and accordingly does not effect the speed at which the device may be operated. Thus, a 4 nanosecond delay or settling time in the input array together with a 1 nanosecond setup and 2 nanosecond clocking time in the macrocells give an overall cycle delay of approximately 7 nanoseconds, allowing operation of the device at speeds on the order of 125 megahertz.

Also, not only does the device have N way branching and N way combinations, but the same is directly programmable rather than requiring iterative programming as in some of the prior art. To accomplish the desired programming, one first constructs a state diagram showing all of the states and all of the paths into and out of each state. The states themselves are divided into two sections, a start and a terminate section, the start section of course being entered upon the occurrence of any condition causing a change to that state, with the terminate section representing an exit from that state upon the occurrence of any condition causing a change of state to a new state. If for instance state A1, the start of state A, can only be entered, other than upon reset, from state B on the occurrence of I2, one can write:

A1:IF (I2·B2) START;

Similarly, if a change from state A to state B is to occur upon the occurrence of I1, or to state C on the occurrence of I3, then one can write:

A2:IF ((I1+I3)·A2) TERMINATE;

This of course represents the termination of state A in favor of state B or state C, depending upon which condition I1 or I3 occurred. Also, if state B can be entered only from states A, C or D on condition I1, one can further write:

B1:If (I1·(A2+C2+D2)) START;

Once the state diagram is fully described by the corresponding set of state equations, the state machine of the present invention may be readily directly programmed therefrom.

Note that with respect to the equation for B1, state B may be entered from any of three other states, dependent upon the occurrence of a decode over the inputs, though only I1 is shown in the place of the decode field. Similarly of course, one also normally wants to be able to exit any given state to one of a plurality of possible states, depending on the condition. This is accomplished in the present invention by the input array providing a product of a sum and a product, rather a product term alone, which would not provide the capability of multiple ways into and out of a state. On the other hand, one could use additional opcodes instead which would also achieve the desired result. By way of example, if one used 8 opcodes, one could obtain the capability of multiple ways into and out of a state using a single product term rather than the product of the sum of the product in the input array. This is not preferred however because of the extent to which the additional opcodes complicate the macrocells. Similarly, the opcodes themselves for each macrocell could be varied on the fly rather than being pre-programmed as desired, though this also is not preferred because of the adverse effect it would have on the operating speed of the device and of course on the complexity thereof. Also while programming of the preferred embodiment is by way of EPROM cells, other programming techniques such as, by way of example, mask programming may also be used.

There has been described herein a new state machine having very high speed, multiple ways into and out of each state, and which is directly programmable from a set of state equations. The speed capabilities of the device, in substantial part, are a result of maintenance of the states in decoded form in macrocells between the input array and the output array, with feedback of the states of the macrocells being provided so that the input to each macrocell may be substantially any logical combination of the state machine input and any macrocell states. While one embodiment has been disclosed and described in detail herein, it will be understood by those skilled in the art that various changes in form and detail may be made in the invention without departing from the spirit and scope thereof.

I claim:

1. A programmable state machine comprising:
   a plurality of clocked macrocells, each having a state register, said macrocells having a cascade input and a cascade output, said cascade output being responsive to the state of said state register in the respective said macrocell, said macrocells having the cascade output of one macrocell coupled to the cascade input of the next macrocell, each of said macrocells being programmably responsive to a condition input and the cascade input to control the state transitions of the state register therein;
   a programmable input array coupled to said macrocells for logically combining state machine inputs to provide said condition inputs to said macrocell; and,
   a programmable output array coupled to said macrocells and responsive to the state of said state register in each said macrocell to provide state machine outputs responsive to the state machine inputs and the programming of said state machine.

2. The programmable state machine of claim 1 wherein said programmable input array is an AND gate array, and includes inverters so as to be responsive to the state machine inputs and the inverse thereof to provide as the condition inputs to said macrocells, the AND of an AND and an OR of the state machine inputs and current state.

3. The programmable state machine of claim 2 wherein each macrocell is programmable to execute one of at least three operations, including (i) a start operation responsive to an input to set the respective state register for one clock cycle, (ii) a toggle operation responsive to an input to change the state of the respective state register, and (iii) a terminate operation responsive to an input to reset the respective state register.

4. The programmable state machine of claim 2 wherein said programmable output array is a programmable OR gate array.

5. The programmable state machine of claim 1 further including feedback means for feeding the state register outputs from said macrocells back to said input array, whereby said input array may be programmed to provide as condition inputs to any of said macrocells, the state register output of any one or more of said macrocells alone or in combination with the logical combination of the state machine inputs.

6. A programmable state machine comprising:
   a plurality of clocked macrocells, each having a state register, said macrocells having a cascade input and a cascade output, said cascade output being responsive to the state of said state register in the respective said macrocell, said macrocells having the cascade output of one macrocell coupled to the cascade input of the next macrocell, each of said macrocells being programmably responsive to a condition input and the cascade input to control the state of the state register therein;
   a programmable AND gate input array coupled to said macrocells for logically combining state machine inputs to provide said condition inputs to said macrocell;
   a programmable OR gate output array coupled to said macrocells and responsive to the state of said state register in each said macrocell to provide state machine outputs responsive to the state machine inputs and the programming of said state machine, and,
   feedback means for feeding the state register outputs from said macrocells back to said input array, whereby said input array may be programmed to provide as condition inputs to any of said macrocells, the state register output of any one or more of said macrocells alone or in combination with the logical combination of the state machine inputs.

7. The programmable state machine of claim 6 wherein said programmable input array includes inverters so as to be responsive to the state machine inputs and the inverse thereof to provide as the condition inputs to said macrocells, the AND of an AND and an OR of the state machine inputs and current state.

8. The programmable state machine of claim 7 wherein each macrocell is programmable to execute one of at least three operations, including (i) a start operation responsive to an input to set the respective state register for one clock cycle, (ii) a toggle operation responsive to an input to invert the state of the respective state register, and (iii) a terminate operation responsive to an input to reset the respective state register.

* * * * *